United States Patent
Alvandpour et al.

(10) Patent No.: US 6,791,364 B2
(45) Date of Patent: Sep. 14, 2004

(54) CONDITIONAL BURN-IN KEEPER FOR DYNAMIC CIRCUITS

(75) Inventors: Atila Alvandpour, Portland, OR (US); Ram K. Krishnamurthy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/896,252

(22) Filed: Jun. 28, 2001

(65) Prior Publication Data

US 2003/0001623 A1 Jan. 2, 2003

(51) Int. Cl.$^7$ ............................................. H03K 19/096
(52) U.S. Cl. ......................................... 326/98; 326/16
(58) Field of Search ............................... 326/16, 83, 95, 326/98, 121

(56) References Cited

U.S. PATENT DOCUMENTS

| | | | | |
|---|---|---|---|---|
| 4,549,101 A | * | 10/1985 | Sood | 307/443 |
| 5,467,026 A | * | 11/1995 | Arnold | 326/16 |
| 6,002,292 A | * | 12/1999 | Allen et al. | 327/379 |

OTHER PUBLICATIONS

WA 17.1 A $2^{nd}$ Generation 440ps SOI 64b Adder, 2000 IEEE International Solid Circuites Conference pp. 288–289.

* cited by examiner

Primary Examiner—Daniel Chang
(74) Attorney, Agent, or Firm—Seth Z. Kalson

(57) ABSTRACT

A dynamic circuit with a conditional keeper for burn-in. In the described embodiments, a conditional keeper is provided which is active only during the burn-in test, where the conditional keeper is sized larger than the standard keepers so as to compensate for additional leakage currents in the dynamic circuit.

24 Claims, 2 Drawing Sheets

CONDITIONAL BURN-IN KEEPER FOR DYNAMIC CIRCUITS

FIELD

Embodiments of the present invention relate to digital circuits, and more particularly, to dynamic circuits.

BACKGROUND

The functionality and reliability of microprocessors are usually tested under conditions that are relatively extreme when compared to normal operating conditions. During testing, the temperature and supply voltage may exceed the upper bounds of their respective target operating ranges. This is often referred to as burn-in or stress testing.

The burn-in process may set a severe constraint on dynamic circuits, requiring relatively large keepers during burn-in to compensate for additional leakage currents due to the higher temperature and supply voltage. Leakage currents are relatively small currents present when a transistor is not fully turned ON, e.g., when the magnitude of the gate-to-source voltage is less than the transistor's threshold voltage. Leakage current may present more of a design problem as transistor sizes are made smaller. Although larger keepers may meet the burn-in condition while compensating for leakage currents in the dynamic circuit, they nevertheless would be oversized for normal operating conditions. Using larger keepers during normal operating conditions may degrade microprocessor performance.

The prior art circuit of FIG. 1 provides a conditional keeper for burn-in, and a normally sized keeper during normal operation, so that the burn-in conditions are met without degrading the performance of the microprocessor during normal operation. See D. Stasiak, et al., "A $2^{nd}$ Generation 440 ps SOI 64b Adder," ISSCC 2000, pp. 288–289.

For simplicity, only one stage of a dynamic circuit is shown in FIG. 1. Network 102 represents a plurality of nMOSFETs (Metal Oxide Semiconductor Field Effect Transistor) configured to conditionally pull node 110 LOW during an evaluation phase so as to synthesize the particular logic function that is desired. During an evaluation phase, pMOSFET 104 is OFF, and during a pre-charge phase, pMOSFET 104 is ON to pull node 110 HIGH. Network 102 in general will have a plurality of input ports for receiving digital voltages, perhaps from other stages in the dynamic circuit.

Inverter 106 and pMOSFET 108 are configured as a keeper (or half-keeper), so that during an evaluation phase node 110 is kept HIGH if network 102 does not pull node 110 LOW. Static CMOS (Complementary Metal Oxide Semiconductor) 116 may be a static inverter or other logic gate, whose output may be provided to another stage of the dynamic circuit.

Inverter 106 and pMOSFET 108 are sized for normal operating conditions. The two stacked pMOSFETs 112 and 114, together with inverter 106, comprise what may be referred to as a conditional keeper for burn-in testing. pMOSFETs 112 and 114 are sized appropriately for the operating conditions of a burn-in test. The gate of pMOSFET 114 is activated by a signal BI-active (Burn-In active), where BI-active is set HIGH when the microprocessor is operating normally, and is set LOW during a burn-in test. With BI-active set LOW, pMOSFET 114 is ON, and inverter 106, together with pMOSFETs 112 and 114, act as a keeper, properly sized for the burn-in conditions.

Stacking MOSFETs, i.e., connecting the drain of one to the source of the other, reduces their overall effective gain. Because pMOSFETs 112 and 114 are in a stacked configuration, they should be sized up approximately twice as large as compared for a single, non-stacked pMOSFET keeper in order to compensate for the reduced gain. However, sizing up pMOSFETs 112 and 114 may have some disadvantages. Sizing up pMOSFETs 112 and 114 uses a larger chip (die) area. Also, the larger size increases the load on inverter 106, which may degrade the response of pMOSFET 108 when performing its standard keeper operation during normal operation conditions. As a result, inverter 106 may also need to be sized larger, which in turn increases the load on node 110, which may result in an increase in switching power and delay of the dynamic gate.

BRIEF DESCRIPTION OF THE DRAWINGS

FIG. 1 is a prior art circuit for a stage of a dynamic circuit with a conditional keeper for burn-in.

DESCRIPTION OF EMBODIMENTS

Figure 1:
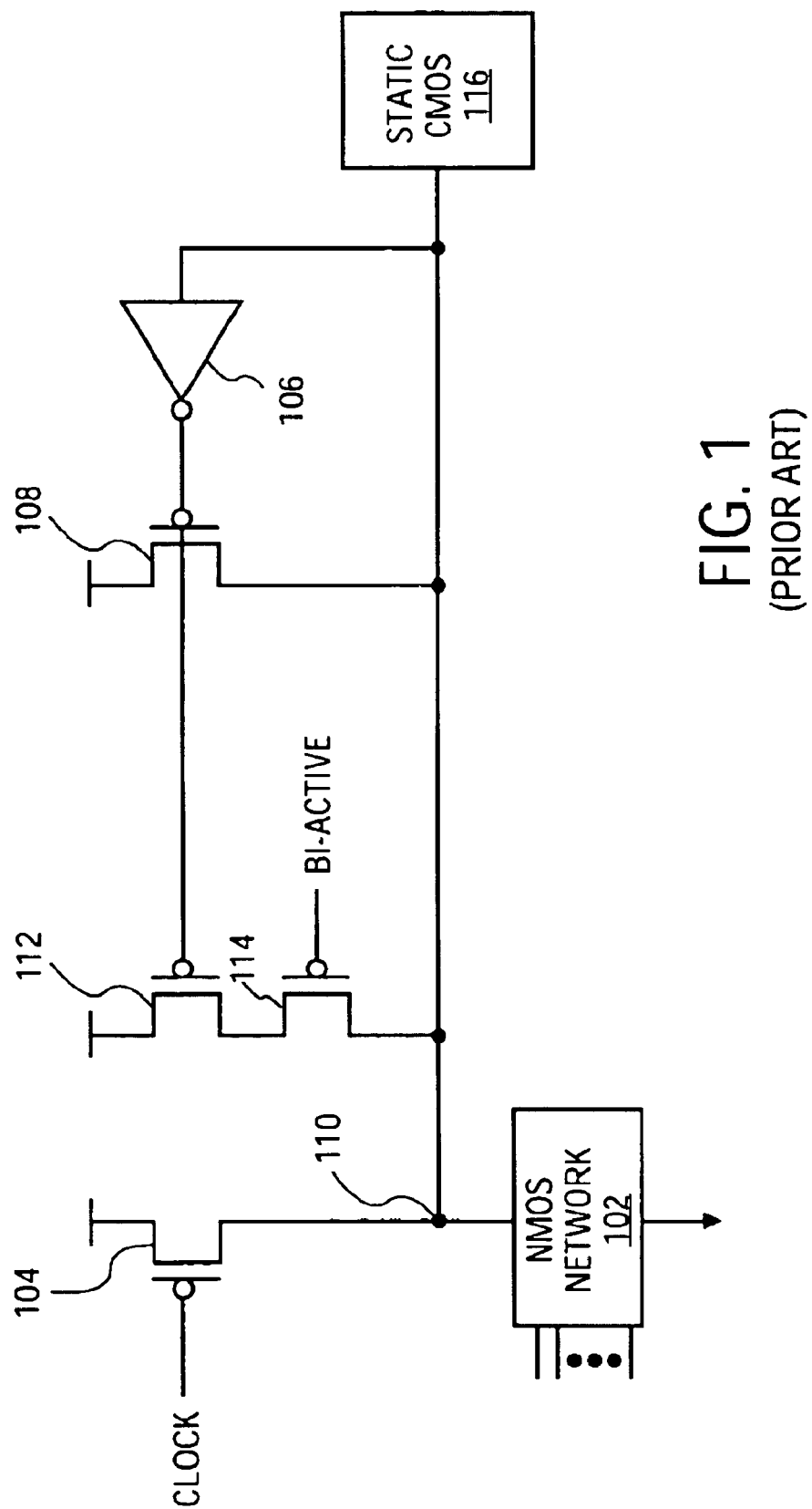
Figure 2:
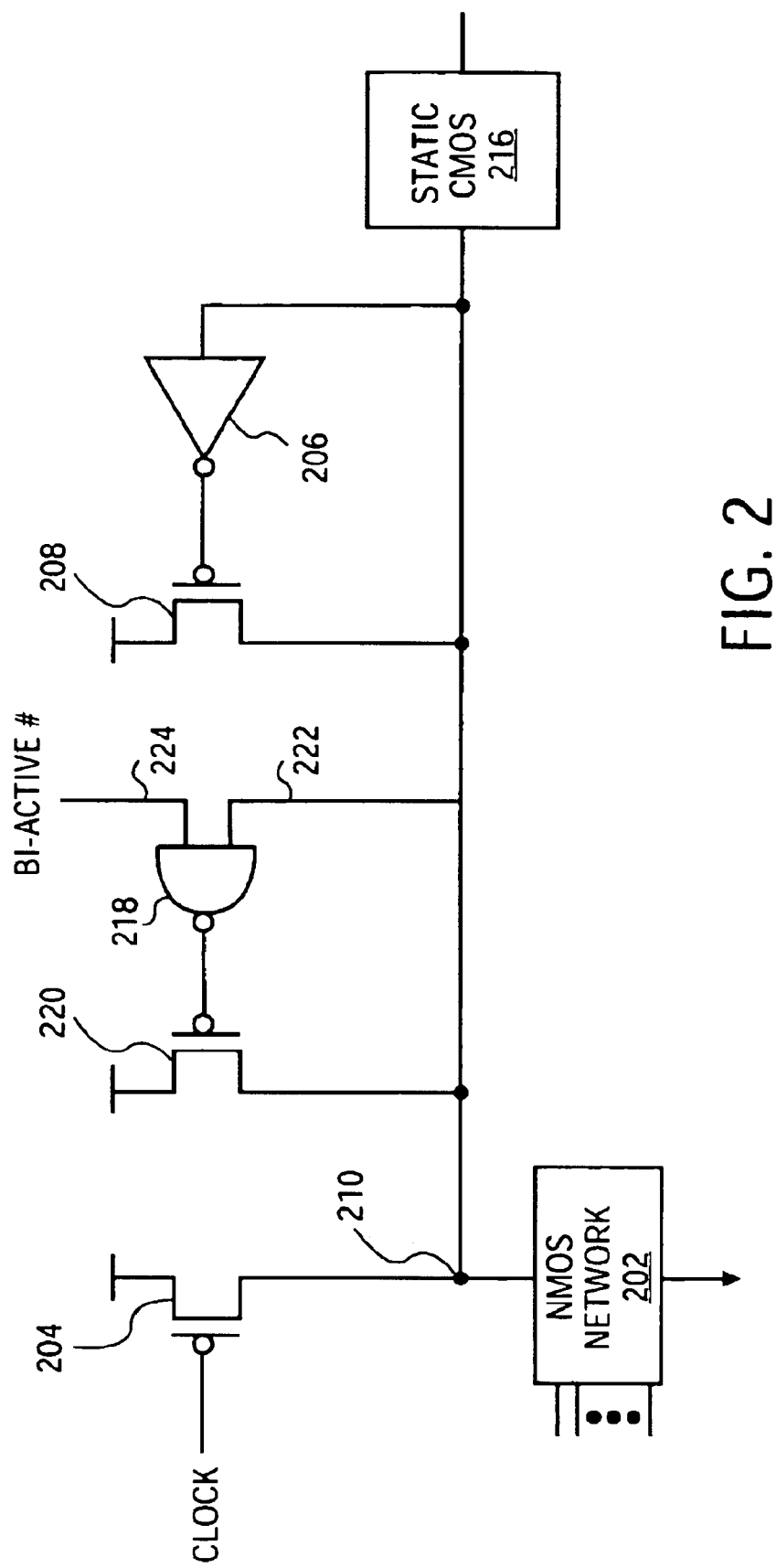
FIG. 2 is a stage of a dynamic circuit with a conditional keeper for burn-in according to an embodiment of the present invention.

FIG. 2 is a circuit according to an embodiment of the present invention, where again for simplicity only one stage of a dynamic circuit is shown. Network 202, pMOSFET 204, and static CMOS 216 provide the same function as network 102, pMOSFET 104, and static CMOS 116, respectively, in FIG. 1. Inverter 206 and pMOSFET 208 comprise a keeper to keep node 210 HIGH if it is not pulled LOW by network 202 during an evaluation phase. NAND gate 218 and pMOSFET 220 comprise a conditional keeper for burn-in. Input port 222 of NAND gate 218 is connected to node 210, and input port 224 of NAND gate 218 is provided with a signal BI-active#, where BI-active# is the complement of BI-active, so that BI-active# is HIGH (BI-active is LOW) during a burn-in test, and BI-active# is LOW (BI-active is HIGH) during normal operation.

It is seen that during burn-in, pMOSFET 220 will also keep node 210 HIGH if it is not pulled LOW by network 202 during an evaluation phase. It is preferable that pMOSFET 220 should be sized so that the combination of pMOSFET 220 and pMOSFET 208 provides a sufficiently strong keeper to compensate for additional leakage currents due to burn-in testing.

For some embodiments, the size of pMOSFET 220 may be made four times smaller than the total size of pMOSFETs 112 and 114, while still compensating for increased leakage currents during burn-in testing. The activation signal BI-active# may be viewed as a DC signal, so that it does not set a constraint on the size of NAND gate 218. The size of NAND gate 218 is set by the target transient response for pMOSFET 220, however for some embodiments pMOSFET 220 may be up to two times smaller than pMOSFET 114. Thus, for some embodiments the total size of NAND gate 218 together with pMOSFET 220 is close to the size of inverter 106 in the prior art, and therefore the total area of the conditional keeper in FIG. 2 may be significantly less than that of the prior art.

Often, the burn-in process tests for reliability and functionality, rather than performance. Consequently, the dynamic circuit may be operated at a lower frequency during a burn-in test than when operated under normal operation conditions. In such cases, performance requirements may be relaxed during the burn-in test, so that the speed and transient response of the conditional keeper may be relaxed as well. Therefore, in such cases, the size of NAND gate 218 may be reduced even further. Hence, for wide dynamic gates (e.g., large number of parallel paths in network 202), the conditional keeper may result in less output load seen by node 210. The lighter load may result in a higher performance for the dynamic circuit during normal operation conditions.

Many other embodiments of the invention than those described herein may be practiced, and many modifications may be made to the described embodiments, without departing from the scope of the invention as claimed below. For example, some pMOSFETs may be replaced with nMOSFETs, and BiCMOS (Bipolar CMOS) as well as other process technologies may be employed.

What is claimed is:

1. A dynamic circuit having an evaluation phase, the dynamic circuit comprising:
   a node;
   at least one nMOSFET to conditionally pull the node LOW during the evaluation phase; and
   a conditional keeper comprising
      a NAND gate having a first input port directly connected to the node and an output port; and
      a first pMOSFET having a gate directly connected to the output port of the NAND gate and having a drain directly connected to the node.

2. The dynamic circuit as set forth in claim 1, further comprising:
   an inverter having an input port and an output port; and
   a second pMOSFET having a gate directly connected to the output port of the inverter and having a drain directly connected to the node;
   wherein the first pMOSFET is sized larger than the second pMOSFET.

3. The dynamic circuit as set forth in claim 2, the NAND gate further comprising:
   a second input port, wherein the conditional keeper provides a keeper function for the node only if the second input port of the NAND gate is held HIGH.

4. The dynamic circuit as set forth in claim 1, the NAND gate further comprising:
   a second input port, wherein the conditional keeper provides a keeper function for the node only if the second input port of the NAND gate is held HIGH.

5. The dynamic circuit as set forth in claim 1, the first pMOSFET further comprising a source, the dynamic circuit further comprising:
   a power rail directly connected to the source of the first pMOSFET.

6. The dynamic circuit as set forth in claim 5, further comprising:
   an inverter having an input port and an output port; and
   a second pMOSFET having a gate directly connected to the output port of the inverter and having a drain directly connected to the node;
   wherein the first pMOSFET is sized larger than the second pMOSFET.

7. The dynamic circuit as set forth in claim 6, the NAND gate further comprising:
   a second input port, wherein the conditional keeper provides a keeper function for the node only if the second input port of the NAND gate is held HIGH.

8. A dynamic circuit comprising:
   a node having a voltage;
   a pullup transistor to pull the node HIGH;
   a network comprising at least one transistor to conditionally pull the node LOW if the pullup transistor is OFF;
   a CMOS static NAND gate having a first input port responsive to the node voltage, having an output port with a voltage, and having a second input port; and
   a first transistor responsive to the output port voltage of the CMOS static NAND gate to pull the node HIGH only if the second input port of the CMOS static NAND gate is HIGH.

9. The dynamic circuit as set forth in claim 8, further comprising:
   an inverter coupled to the node; and
   a second transistor coupled to the inverter and the node to provide a keeper function.

10. The dynamic circuit as set forth in claim 9, wherein the first transistor is sized larger than the second transistor.

11. The dynamic circuit as set forth in claim 8, further comprising:
   a power rail, wherein the first transistor is coupled to the power rail to provide a low impedance path between the node and the power rail if ON.

12. The dynamic circuit as set forth in claim 11, further comprising:
   an inverter coupled to the node; and
   a second transistor coupled to the inverter and the node to provide a keeper function.

13. The dynamic circuit as set forth in claim 12, wherein the first transistor is sized larger than the second transistor.

14. A dynamic circuit having a normal operating condition and a burn-in condition, the dynamic circuit comprising:
   a node having a voltage;
   a network comprising at least one transistor to conditionally pull the node Low;
   a logic gate having a first input port responsive to the node voltage, a second input port, and an output port having a voltage;
   a first transistor responsive to the output port voltage of the logic gate, and coupled to the node; and
   wherein the first transistor and the logic gate provide a keeper function to the node if and only if the second input port of the logic gate is at a voltage indicative of the dynamic circuit being in the burn-in condition.

15. The dynamic circuit as set forth in claim 14, wherein the first transistor is a pMOSFET having a gate connected to the output port of the logic gate and a drain connected to the node.

16. The dynamic circuit as set forth in claim 15, wherein the logic gate is a NAND gate.

17. The dynamic circuit as set forth in claim 16, further comprising:
   a second transistor coupled to the node; and
   an inverter coupled to the second transistor and the node, so that the combination of the second transistor and the inverter provide a keeper function to the node.

18. The dynamic circuit as set forth in claim 17, wherein the first transistor is sized larger than the second transistor.

19. The dynamic circuit as set forth in claim 14, further comprising:
   a second transistor coupled to the node; and
   an inverter coupled to the second transistor and the node, so that the combination of the second transistor and the inverter provide a keeper function to the node.

20. The dynamic circuit as set forth in claim 19, wherein the first transistor is sized larger than the second transistor.

21. The dynamic circuit as set forth in claim 14, further comprising:
   a power rail, wherein the first transistor is coupled to the power rail to provide a low impedance path between the node and the power rail if ON.

22. The dynamic circuit as set forth in claim 21, wherein the first transistor is a pMOSFET having a gate connected to the output port of the logic gate and a drain connected to the node.

23. The dynamic circuit as set forth in claim 22, wherein the logic gate is a NAND gate.

24. A dynamic circuit having an evaluation phase, the dynamic circuit comprising:

a node;

a power rail;

at least one nMOSFET to conditionally pull the node LOW during the evaluation phase; and a conditional keeper comprising
      a NAND gate having a first input port directly connected to the node and an output port; and
      a first pMOSFET having a gate directly connected to the output port of the NAND gate, a drain directly connected to the node, and a source directly connected to the power rail.

* * * * *